United States Patent
Mueller et al.

(10) Patent No.: US 7,365,013 B2
(45) Date of Patent: Apr. 29, 2008

(54) SYSTEM FOR THE PREFERENTIAL REMOVAL OF SILICON OXIDE

(75) Inventors: Brian L. Mueller, Aurora, IL (US); Jeffery P. Chamberlain, Aurora, IL (US); David J. Schroeder, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/620,517

(22) Filed: Jan. 5, 2007

(65) Prior Publication Data

US 2007/0120090 A1 May 31, 2007

Related U.S. Application Data

(60) Division of application No. 10/660,687, filed on Sep. 11, 2003, which is a continuation of application No. 09/547,425, filed on Apr. 11, 2000, now abandoned.

(51) Int. Cl.
*H01L 21/302* (2006.01)

(52) U.S. Cl. ........................ 438/693; 438/692

(58) Field of Classification Search ................ 438/689, 438/690, 691, 692, 693; 51/307, 308, 309
See application file for complete search history.

(56) References Cited

U.S. PATENT DOCUMENTS

| | | | |
|---|---|---|---|
| 3,328,141 A | 6/1967 | Lachapelle | |
| 3,385,682 A | 5/1968 | Lowen | |
| 3,429,080 A | 2/1969 | Lachapelle | |
| 3,615,955 A | 10/1971 | Regh et al. | |
| 3,887,403 A | 6/1975 | Coggins | |
| 3,930,870 A | 1/1976 | Basi | |
| 4,169,337 A | 10/1979 | Payne | |
| 4,332,649 A | 6/1982 | Sälzle | |
| 4,343,116 A | 8/1982 | Murphy et al. | |

(Continued)

FOREIGN PATENT DOCUMENTS

EP 0 373 501 B1 3/1995

(Continued)

OTHER PUBLICATIONS

Cook, "Chemical Processes in Glass Polishing," *Journal of Non-Crystalline Solids*, 120: 152-171 (1990).

(Continued)

*Primary Examiner*—Kevin M Picardat
(74) *Attorney, Agent, or Firm*—Thomas E. Omholt; Susan Steele

(57) ABSTRACT

A system, composition, and a method for planarizing or polishing a composite substrate are provided. The planarizing or polishing system comprises (i) a polishing composition comprising (a) about 0.5 wt. % or more of fluoride ions, (b) about 1 wt. % or more of an amine, (c) about 0.1 wt. % or more of a base, and (d) water, and (ii) an abrasive. The present invention also provides a method of planarizing or polishing a composite substrate comprising contacting the substrate with a system comprising (i) a polishing composition comprising (a) about 0.5 wt. % or more of fluoride ions, (b) about 1 wt. % or more of an amine, (c) about 0.1 wt. % or more of a base, and (d) water, and (ii) an abrasive.

31 Claims, 1 Drawing Sheet

U.S. PATENT DOCUMENTS

| | | |
|---|---|---|
| 4,462,188 A | 7/1984 | Payne |
| 4,555,304 A | 11/1985 | Sälzle |
| 4,671,851 A | 6/1987 | Beyer et al. |
| 4,954,141 A | 9/1990 | Takiyama et al. |
| 4,983,650 A | 1/1991 | Sasaki |
| 5,139,571 A | 8/1992 | Deal et al. |
| 5,169,491 A | 12/1992 | Doan |
| 5,176,752 A | 1/1993 | Scheiner |
| 5,182,221 A | 1/1993 | Sato |
| 5,246,624 A | 9/1993 | Miller et al. |
| 5,387,361 A | 2/1995 | Kohara et al. |
| 5,407,526 A | 4/1995 | Danielson et al. |
| 5,478,436 A | 12/1995 | Winebarger et al. |
| 5,494,857 A | 2/1996 | Cooperman et al. |
| 5,498,565 A | 3/1996 | Gocho et al. |
| 5,516,346 A | 5/1996 | Cadien et al. |
| 5,614,444 A | 3/1997 | Farkas et al. |
| 5,690,807 A | 11/1997 | Clark, Jr. et al. |
| 5,700,383 A | 12/1997 | Feller et al. |
| 5,720,823 A | 2/1998 | Carlson et al. |
| 5,721,173 A | 2/1998 | Yano et al. |
| 5,738,800 A | 4/1998 | Hosali et al. |
| 5,769,689 A | 6/1998 | Cossaboon et al. |
| 5,769,691 A | 6/1998 | Fruitman |
| 5,783,495 A | 7/1998 | Li et al. |
| 5,855,811 A | 1/1999 | Grieger et al. |
| 5,860,848 A | 1/1999 | Loncki et al. |
| 5,863,838 A | 1/1999 | Farkas et al. |
| 5,938,505 A | 8/1999 | Morrison et al. |
| 5,954,997 A | 9/1999 | Kaufman et al. |
| 5,962,343 A | 10/1999 | Kasai et al. |
| 5,993,686 A | 11/1999 | Streinz et al. |
| 6,019,806 A | 2/2000 | Sees et al. |
| 6,046,112 A | 4/2000 | Wang |
| 6,063,306 A | 5/2000 | Kaufman et al. |
| 6,121,143 A | 9/2000 | Messner et al. |
| 6,177,026 B1 | 1/2001 | Wang et al. |
| 6,238,829 B1 | 5/2001 | Seki |
| 6,267,644 B1 | 7/2001 | Molnar |
| 6,291,349 B1 | 9/2001 | Molnar |
| 6,471,735 B1 | 10/2002 | Misra et al. |
| 6,533,832 B2 | 3/2003 | Steckenrider et al. |

FOREIGN PATENT DOCUMENTS

| | | |
|---|---|---|
| EP | 0 853 110 A1 | 7/1998 |
| EP | 0 853 335 A2 | 7/1998 |
| EP | 0 926 715 A2 | 6/1999 |
| WO | WO 97/47030 | 12/1997 |
| WO | WO 99/62628 A1 | 12/1999 |
| WO | WO 00/00560 A1 | 1/2000 |

OTHER PUBLICATIONS

Hyashi et al. "Ammonium-Salt-Added Silica Slurry for the Chemical Mechanical Polishing of the Interlayer Dielectric Film Planarization in ULSI's," *Jpn. J. Appl. Phys.*, 34(2B): pt.1 (1995).

*Angus Chemical Company Technical Data Sheet*, DMAMP-80, TDS 18 (1994).

Holland et al., "Controlling Dielectric Removal Rate and Uniformity in Several New CMP Processes," *First International Dielectrics for VLS/USLI Multilevel Interconnection Conference (DUMIC)*, Santa Clara, CA (Feb. 21-22, 1995).

SYSTEM FOR THE PREFERENTIAL REMOVAL OF SILICON OXIDE

CROSS-REFERENCE TO RELATED APPLICATIONS

This patent application is a divisional of U.S. patent application Ser. No. 10/660,687, filed Sep. 11, 2003, which is a continuation of U.S. patent application Ser. No. 09/547,425, filed Apr. 11, 2000, which is abandoned.

TECHNICAL FIELD OF THE INVENTION

The present invention relates to a planarizing or polishing system and method for planarizing or polishing a composite substrate.

BACKGROUND OF THE INVENTION

As the size of integrated circuits is reduced and the number of integrated circuits on a chip increases, the components that make up the circuits must be positioned closer together in order to comply with the limited space available on a typical chip. Current research, therefore, is directed towards achieving a greater density of active components per unit area of a semiconductor substrate. Accordingly, effective isolation between circuits is becoming more important for ensuring optimum semiconductor performance. Conventional isolation of circuit components in modern integrated circuit technology takes the form of shallow trenches, which are etched into the semiconductor substrate and filled with an insulating material, such as silicon dioxide. These areas are generally referred to in the art as shallow trench isolation (STI) regions. STI regions serve to isolate the active regions of the integrated circuit.

A problem associated with STI processing is planarization of the semiconductor substrate following trench formation (i.e., after the trench is etched and then filled with an insulation material). In particular, after trenches are filled with insulation material, it is necessary to selectively remove protrusions of the insulation material from the "mesa" regions between each trench of the semiconductor substrate. This requires the selective removal of the oxide insulating material over the barrier film (typically a nitride material) that tops the mesa regions. The complete removal of oxides from the mesa regions must be accomplished with minimal thinning of the underlying barrier film, in order to ensure uniform thickness of the barrier film across the semiconductor substrate. Planarity of the semiconductor substrate is, in fact, crucial for maximal semiconductor performance. A highly planar surface topography reduces the potential for current leakage (i.e., short-circuiting) between active regions of the integrated circuit. In addition, a high degree of planarity reduces the potential for depth of focus lithography problems during subsequent interconnect processing steps. Accordingly, excellent planarization or polishing processes following trench formation are critical for ensuring optimum semiconductor performance.

Attempts to solve the problem of providing a highly planarized integrated circuit structure, after having formed oxide-filled STI regions in the substrate, have resulted in a number of planarization schemes. Conventional planarization schemes include, for example, 'integration schemes' which combine conventional chemical-mechanical polishing (CMP) slurries with dummy structures, oxide reverse masks and etches, dual nitrides, hard masks, and/or resist blocks. U.S. Pat. No. 5,721,173 (Yano et al.), for example, is directed to a method of forming a trench isolation structure involving a two-step process of planarizing by CMP using a slurry and, then, wet-etching with an HF solution. Most conventional schemes, however, are time-consuming and expensive, and can be inefficient during one or more processing steps.

A need remains, therefore, for polishing systems, compositions, and/or methods that, when used alone or in combination with conventional planarization or integration schemes, will exhibit minimal barrier film thinning and will result in maximal barrier film planarity (i.e., thickness uniformity) across a composite substrate, particularly after the substrate has undergone shallow trench isolation processing. The present invention seeks to provide such a polishing system, composition, and method. These and other advantages of the present invention will be apparent from the description of the invention provided herein.

BRIEF SUMMARY OF THE INVENTION

The present invention provides a system for planarizing or polishing a composite substrate comprising (i) a polishing composition comprising (a) about 0.5 wt. % or more of fluoride ions, (b) about 1 wt. % or more of an amine, (c) about 0.1 wt. % or more of a base, and (d) water, and (ii) an abrasive. The present invention also provides a method of planarizing or polishing a composite substrate comprising contacting the substrate with a system comprising (i) a polishing composition comprising (a) about 0.5 wt. % or more of fluoride ions, (b) about 1 wt. % or more of an amine, (c) about 0.1 wt. % or more of a base, and (d) water, and (ii) an abrasive.

DETAILED DESCRIPTION OF THE INVENTION

Figure 1:
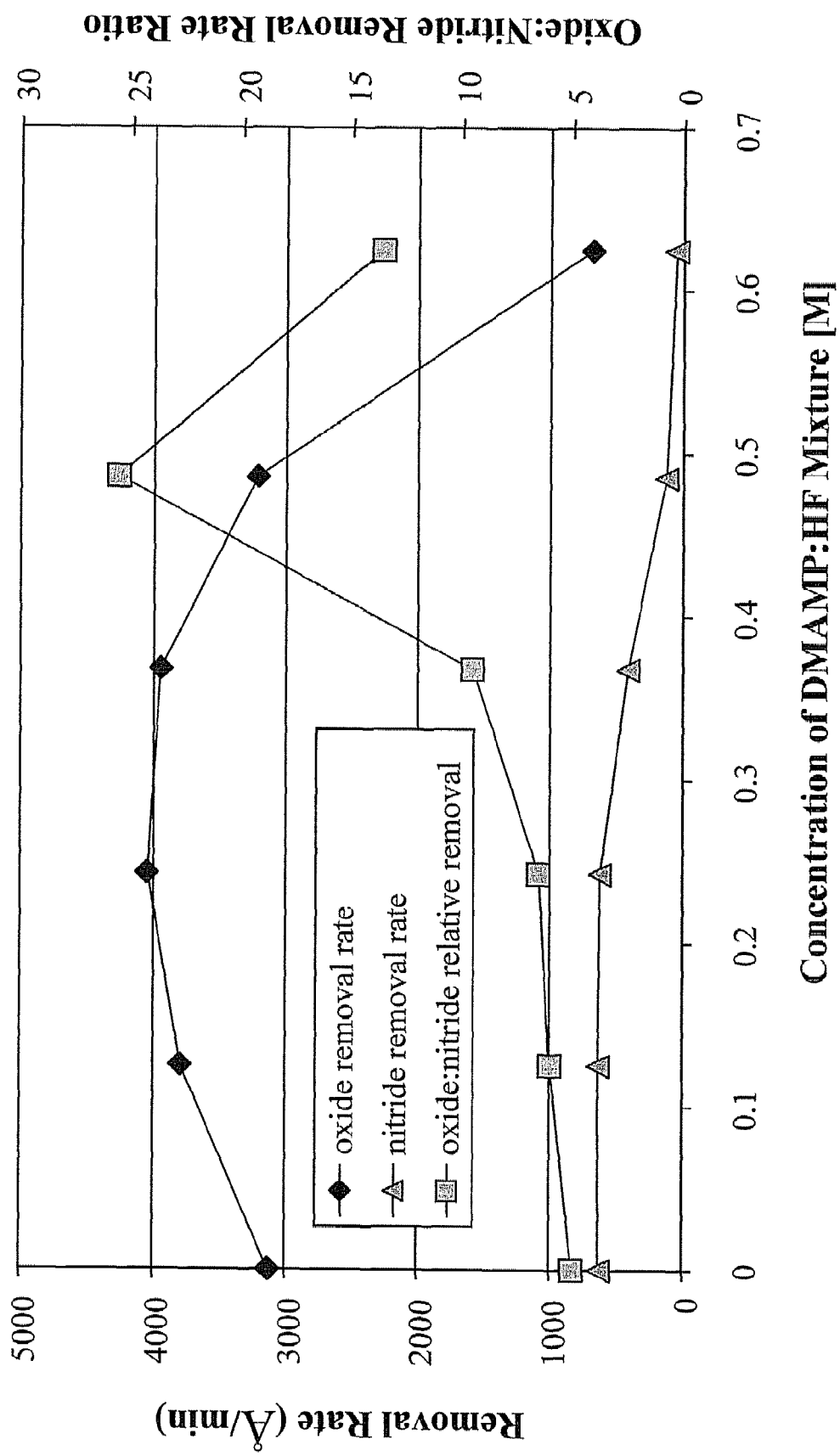
FIG. 1 is a graph of the concentration of the amine and source of fluoride ions (i.e., concentration of DMAMP:HF mixture) in the polishing system of the present invention versus the relative removal rates of oxides and nitrides and the oxide:nitride removal rate ratio.

The present invention provides a system for planarizing or polishing a composite substrate comprising (i) a polishing composition comprising (a) about 0.5 wt. % or more of fluoride ions, (b) about 1 wt. % or more of an amine, (c) about 0.1 wt. % or more of a base, and (d) water, and (ii) an abrasive. The polishing system exhibits minimal barrier film thinning and results in maximal barrier film planarity (i.e., thickness uniformity) across a composite substrate, particularly after the substrate has undergone shallow trench isolation processing.

The abrasive of the polishing system can be any suitable abrasive. Suitable abrasives include, for example, metal oxide abrasives. Metal oxide abrasives include, for example, alumina, silica, titania, ceria, zirconia, germania, magnesia, coformed products thereof, and mixtures thereof. Suitable abrasives also include heat-treated abrasives and chemically-treated abrasives (e.g., abrasives with chemically-linked organic functional groups). Preferably, the abrasive of the polishing system is silica. More preferably, the abrasive of the polishing system is fumed silica.

The abrasive of the polishing system can exist in any suitable form. It is suitable, for example, for the abrasive to be incorporated into the polishing composition, e.g., the aqueous medium of the polishing system. It is also suitable for the abrasive of the polishing system to be fixed (e.g., embedded), in whole or in part, in or on a polishing pad.

It is suitable for the abrasive to be present in the polishing composition, e.g., the aqueous medium of the polishing system, in any suitable concentration. The abrasive desirably is present in a concentration of about 0.1 wt. % or more (e.g., about 0.1-40 wt. %) in the polishing composition. Preferably, the abrasive concentration is about 0.1-30 wt. % of the polishing composition, e.g., about 1-30 wt. % of the polishing composition, or even about 5-25 wt. % of the polishing composition.

The fluoride ions of the polishing system can be from any suitable source of fluoride ions. Suitable sources of fluoride ions include, for example, hydrogen fluoride, ammonium fluoride, ammonium hydrogen bifluoride, potassium fluoride, potassium hydrogen bifluoride, fluotitanic acid, fluosilicic acid, fluozirconic acid, fluoboric acid, and other fluoride salts, fluoride acids, fluoride metal complexes, and combinations thereof.

The fluoride ions are present in the polishing system in any suitable amount, desirably in an amount of about 0.5 wt. % or more. Most preferably, the fluoride ions are present in the polishing system in an amount of about 0.6 wt. % or more, e.g., about 0.7 wt. % or more, about 0.8 wt. % or more, about 0.9 wt. % or more, or even about 0.95 wt. % or more (e.g., about 1 wt. % or more). It is also suitable for the fluoride ions to be present in the polishing system in a concentration of about 1.25 wt. % or more, about 1.5 wt. % or more, or even about 1.75 wt. % or more. Moreover, it is suitable for the fluoride ions to be present in the polishing system in higher concentrations, such as about 2 wt. % or more, about 3 wt. % or more, about 4 wt. % or more, or even about 5 wt. % or more. Generally, the fluoride ions are present in the polishing system in an amount that does not exceed about 15 wt. %, preferably an amount that does not exceed about 10 wt. % (e.g., about 0.5-10 wt. %, or more preferably, about 1-5 wt. %).

The fluoride ions of the polishing system can exist in two forms in the polishing system: an "inactive" form (i.e., ions bound to other components of the polishing system, such as the amine component) and an "active" form (i.e., free or unbound ions accessible to react with the composite substrate being planarized or polished). While 100% of the fluoride ions can be in active form, more typically a portion of the fluoride ions will be in inactive form (i.e., less than about 100% of the fluoride ions of the polishing system are in active form). Thus, about 95% or less of the fluoride ions of the polishing system can be in active form, e.g., about 90% or less, or even about 85% or less. Moreover, it is possible for about 75% or less of the fluoride ions of the polishing system to be active form, e.g., about 65% or less, about 55% or less, about 45% or less, or even about 30% or less. In general, about 1% or more of the fluoride ions of the polishing system will be in active form, e.g., about 10% or more.

The concentration of active fluoride ions in the polishing system can be determined by any suitable technique. It is suitable, for example, for the concentration of active fluoride ions to be measured through utilization of a fluoride ion-specific electrode. It is also suitable for the concentration of active fluoride ions to be measured via the technique disclosed in U.S. Pat. No. 3,329,587.

The amine of the polishing system can be any suitable amine. Suitable amines include, for example, amino alcohols. Suitable amino alcohols include, for example, amine-containing derivatives of $C_1$-$C_{12}$ alkanols, e.g., amine-containing derivatives of $C_1$-$C_6$ alkanols. Suitable amine-containing alkanols include, for example, ethanolamine, methylaminoethanol, dimethylaminoethanol, diethylaminoethanol, isopropanolamine, methylaminopropanol, dimethylaminopropanol, diethylaminopropanol, and higher alkyl derivatives thereof, such as amine-containing derivatives of butanol, pentanol, hexanol, heptanol, octanol, nonanol, and decanol. Preferably, the amine of the polishing system is monomethyl-2-amino-2methylpropanol or 2-dimethylamino-2-methyl-1-propanol. The amine can have any suitable $pK_b$ value. It is suitable, for example, for the amine to have a $pK_b$ value of 1-7, e.g., 2-6. Preferably, the amine has a $pK_b$ value of 3-6, e.g., 4-5.

The amine is present in the polishing system in any suitable amount, desirably in an amount of about 1 wt. % or more, e.g., about 1.5 wt. % or more. Preferably, the amine is present in the polishing system in an amount of about 2 wt. % or more, e.g., about 3 wt. % or more, or even about 4 wt. % or more. More preferably, the amine is present in the polishing system in an amount of about 5 wt. % or more, e.g., about 6 wt. % or more, or even about 7 wt. % or more. It is also suitable for the amine to be present in the polishing system in an amount of about 8 wt. % or more, about 10 wt. % or more, about 12 wt. % or more, or even about 15 wt. % or more. Generally, the amine is present in the polishing system in an amount that does not exceed about 25 wt. %, preferably an amount that does not exceed about 20 wt. % (e.g., about 1-20 wt. % or more preferably about 1-10 wt. %).

The base of the polishing system can be any suitable base. Suitable bases include, for example, inorganic hydroxide bases and carbonate bases. Preferably, the base of the polishing system is selected from the group consisting of potassium hydroxide, sodium hydroxide, ammonium hydroxide, cesium hydroxide, sodium carbonate, and mixtures thereof.

Any suitable amount of the base can be present in the polishing system. The base desirably is present in the polishing system in an amount of about 0.1 wt. % or more. It is also suitable for the base to be present in the polishing system in an amount of about 0.5 wt. % or more, about 1 wt. % or more, about 2 wt. % or more, or even about 3 wt. % or more. The base may also be present in the polishing system in an amount of about 4 wt. % or more, e.g., about 5 wt. % or more. Generally, the base is present in the polishing system in an amount that does not exceed about 15 wt. %, preferably an amount that does not exceed about 10 wt. % (e.g., about 1-10 wt. % or more preferably about 2-8 wt. %).

The polishing system can further comprise a quaternary ammonium compound. Suitable quaternary ammonium compounds include, for example, tetraalkyl ammonium compounds (e.g., wherein the "alkyl" is a $C_1$-$C_{12}$ alkyl; preferably, a $C_1$-$C_6$ alkyl). Preferably, the quaternary ammonium compound is tetramethylammonium hydroxide.

The polishing system optionally can further comprise one or more other additives. Such additives include surfactants (e.g., cationic surfactants, anionic surfactants, anionic polyelectrolytes, nonionic surfactants, amphoteric surfactants, fluorinated surfactants, and mixtures thereof), film-forming agents (e.g., heterocyclic organic compounds, such as benzotriazole, triazole, benzimidazole, or mixtures thereof), polymeric stabilizers or other surface active dispersing agents (e.g., phosphoric acid, organic acids, tin oxides, and phosphonate compounds), pH buffers (e.g., potassium phosphate), and polishing accelerators such as catalysts, oxidizers, and additional chelating or complexing agents (e.g., metal, particularly ferric, nitrates, sulfates, halides (including chlorides, bromides, and iodides), compounds with carboxylate, hydroxyl, sulfonic, and/or phosphonic groups, di-, tri-, multi-, and poly-carboxylic acids and salts (such as tartaric acids and tartrates, malic acid and malates, malonic acid and malonates, gluconic acid and gluconates, citric acid and citrates, phthalic acid and phthalates, pyrocatecol, pyrogallol, gallic acid and gallates, tannic acid and tannates), peroxides, periodic acid and salts, perbromic acid and salts, perchloric acid and salts, perboric acid and salts, iodic acid and salts, permaganates, potassium ferricyanide, chlorates, percarbonates, persulfates, bromates, chromates, cerium compounds, and mixtures thereof).

The pH of the polishing system can be any suitable pH. Preferably, the pH of the present polishing system is about 7-14, e.g., about 8-13. More preferably, the pH of the polishing system is about 9-12, e.g., about 10-12, or even about 11-12. In an alternative embodiment, when selectively polishing metals, metal composites, or mixtures or alloys thereof, it is suitable for the polishing system to have a pH of about 2-6, e.g., about 3-5. Such metals, metal composites, and metal alloys include, for example, copper, aluminum, titanium, tantalum, tungsten, gold, platinum, iridium, ruthenium, metal nitrides (e.g., titanium nitride, tantalum nitride, and tungsten nitride), metal carbides (e.g., silicon carbide and tungsten carbide), and nickel-phosphorous.

The polishing system desirably has a polishing selectivity of silicon oxide to silicon nitride (i.e., oxide:nitride) of about 2:1 or more, e.g., about 5:1 or more. Preferably, the polishing system has a polishing selectivity of oxide:nitride of about 10:1 or more, e.g., about 15:1 or more, or even about 25:1 or more. More preferably, the polishing system has a polishing selectivity of oxide:nitride of about 35:1 or more, e.g., about 45:1 or more, or even about 55:1 or more. Most preferably, the polishing system has a polishing selectivity of oxide:nitride of about 65:1 or more, e.g. about 75:1 or more, or even about 90:1 or more.

Silicon oxide removal by the polishing system can be controlled by altering the relative concentrations of the components of the polishing system. In particular, the concentration of active fluoride ions in the polishing system, which is directly related to the oxide removal rate, can be controlled by altering the relative concentrations of the fluoride ions, the amine, and quaternary ammonium compound (if present) in the polishing system, as well as by adding complexing agents to the polishing system, or by altering the pH of the polishing system.

Silicon nitride removal by the polishing system can be controlled by altering the relative concentrations of the components of the polishing system. Cationic species (i.e., amines, such as hydrogenated amines, and quaternary ammonium compounds) adsorb to the silicon nitride layer and reduce, substantially reduce, or even inhibit (i.e., block) the removal of silicon nitride during polishing. The base in the polishing system neutralizes the cationic amine, thereby reducing its ability to adsorb to the silicon nitride layer and to inhibit its removal. In this regard, silicon nitride removal by the polishing system can be controlled by altering the relative concentrations of the amine, the base, and quaternary ammonium compound (if present) in the polishing system, as well as by altering the pH of the polishing system.

The free alkalinity and the total alkalinity of the polishing system are determined in order to quantify the buffering capacity of the polishing system. Free alkalinity and total alkalinity values are determined via titration and can be monitored with any technique or device that determines pH (e.g., a pH meter). The polishing system desirably has a free alkalinity value of about 0.001-0.15 mol/l. Preferably, the polishing system has a free alkalinity value of about 0.005-0.1 mol/l, e.g., about 0.01-0.1 mol/l. The polishing system desirably has a total alkalinity value of about 0.005-0.2 mol/l. Preferably, the polishing system has a total alkalinity value of about 0.008-0.15 mol/l, e.g., about 0.01-0.125 mol/l. More preferably, the polishing system has a total alkalinity value of about 0.01-0.1 mol/l.

The present invention also provides a method of planarizing or polishing a composite substrate with a polishing system as described herein, wherein the polishing system contains any suitable concentration of an abrasive, fluoride ions, an amine, a base, and water. As noted above, the abrasive can be in the polishing composition, e.g., the aqueous medium of the polishing system, and/or fixed (e.g., embedded) in or on the polishing pad. Thus, the present invention provides a method of planarizing or polishing a composite substrate comprising contacting the substrate with a system comprising (i) a polishing composition comprising (a) about 0.5 wt. % or more of fluoride ions, (b) about 1 wt. % or more of an amine, (c) about 0.1 wt. % or more of a base, and (d) water, and (ii) an abrasive. The composite substrate can be any suitable composite substrate. Typically, the composite substrate will be a substrate (e.g., silicon substrate) with a metal oxide component (e.g., silicon oxide) and/or a nitride component (e.g., silicon nitride).

The polishing system is particularly well-suited for planarizing or polishing a substrate that has undergone shallow trench isolation (STI) processing. STI processing typically involves providing a silicon substrate on which is deposited a layer of silicon dioxide and a layer of silicon nitride. Trenches are etched following photolithography and are filled with silicon dioxide. The excess silicon dioxide is planarized until the silicon nitride is fully exposed, such that the silicon oxide remaining in the trenches is approximately level with the silicon nitride level on the mesa regions or with the pad oxide level. Desirably, the planarization or polishing is carried out in such typical STI processing with the polishing system of the present invention, preferably such that the silicon dioxide is removed and planarization stops at the silicon nitride layer.

The polishing system also can be used to planarize or polish hardened workpieces, such as prime silicon, rigid or memory disks, metals (e.g., noble metals and low k metals), ILD layers, micro-electro-mechanical systems, ferroelectrics, magnetic heads, polymeric films, and low and high dielectric constant films.

A substrate can be planarized or polished with the polishing system by any suitable technique. In this regard, it is suitable for the polishing system to be formulated prior to delivery to the polishing pad or to the surface of the substrate. It is also suitable for the polishing system to be formulated (e.g., mixed) on the surface of the polishing pad or on the surface of the substrate, through delivery of the components of the polishing system from two or more distinct sources, whereby the components of the polishing system meet at the surface of the polishing pad or at the surface of the substrate. In this regard, the flow rate at which the components of the polishing system are delivered to the polishing pad or to the surface of the substrate (i.e., the delivered amount of the particular components of the polishing system) can be altered prior to the polishing process and/or during the polishing process, such that the polishing selectivity and/or viscosity of the polishing system is altered. Moreover, it is suitable for the particular components of the polishing system being delivered from two or more distinct sources to have different pH values, or alternatively to have substantially similar, or even equal, pH values, prior to delivery to the surface of the polishing pad or to the surface of the substrate. It is also suitable for the particular components being delivered from two or more distinct sources to be filtered either independently or to be filtered jointly (e.g., together) prior to delivery to the surface of the polishing pad or to the surface of the substrate.

A substrate can be planarized or polished with the polishing system with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and coformed products thereof, and mixtures thereof. As discussed above, the abrasive of the polishing system can be fixed (e.g., embedded) in whole or in part, in or on the polishing pad such fixation on the polishing pad can be accomplished, for example, by blending the abrasive in to the aforementioned polymers during the formation of the polishing pad.

The polishing system (especially the polishing composition with the abrasive therein) desirably has a viscosity that is about 25 centipoise or more, e.g., about 100 centipoise or more, or even about 500 centipoise or more. Preferably, the viscosity of the polishing system is about 1000 centipoise or more, e.g., about 2000 centipoise or more. More preferably, the viscosity of the polishing system is about 3000 centipoise or more, e.g., about 4000 centipoise or more, or even about 5000 centipoise or more. Most preferably, the viscosity of the polishing system is about 6000-9000 centipoise (such as about 7000-8000 centipoise). The relatively high viscosity of the polishing system allows for a decrease in the total amount of the polishing system needed for the effective polishing of a composite substrate. The viscosity of the polishing system can be determined in any suitable manner. The viscosity values set forth herein, for example, were determined by using a Brookfield Viscometer (i.e., Model # LVDVI, which has a voltage of 115 and a measurement range of 15-2,000,000 cP) and a suitable spindle (i.e., LV Spindle #4).

The viscosity of the polishing system can be adjusted by altering the concentrations of the particular components of the polishing system. The viscosity of the polishing system also can be adjusted through the addition to the polishing system of any suitable rheological control agent (i.e., a polymeric rheological control agent). Suitable rheological control agents include, for example, urethane polymers (e.g., urethane polymers with a molecular weight greater than about 100,000 Daltons), and acrylates comprising one or more acrylic subunits (e.g., vinyl acrylates and styrene acrylates), and polymers, copolymers, and oligomers thereof, and salts thereof.

It is desirable in some instances to alter the polishing selectivity of the polishing system in situ, e.g., during the polishing process. This can be accomplished in any suitable manner, e.g., via feed-forward or feed-back control. The polishing process can be adjusted, for example, by increasing or decreasing polishing aggressiveness. Polishing aggressiveness can be altered by increasing or decreasing the pressure with which the pad and substrate contact each other, increasing or decreasing the carrier speed of the substrate during contact with the pad, increasing or decreasing the platen speed of the pad during contact with the substrate, or any combination thereof.

Following planarization or polishing of a composite substrate, the used polishing system can be combined with any compound suitable for enhancing the disposability of the polishing system. Suitable compounds include, for example, acids which will decrease the pH of the used polishing system, calcium-containing salts which will act as complexing agents to fluoride ions, and other compounds known to ordinary artisans. These compounds can be added to the polishing system of the present invention in any suitable manner. It is suitable, for example, for the compound to be added to the waste stream by which the polishing system exits the polishing surface.

EXAMPLE 1

This example further illustrates the present invention but, of course, should not be construed in any way limiting its scope. In accordance with the present invention, a polishing system was formulated as follows:

Component A was prepared by combining 10,000 g Cabot's Semi-Sperse® 25 fumed silica aqueous dispersion (25 wt. % fumed silica in water) and 177 g 2-dimethylamino-2-methyl-1-propanol 80 (DMAMP-80) (available from ANGUS Chemical Company). Component B was prepared by combining 34.5 wt. % deionized water, 12.7 wt. % KOH (40% concentration in water), 14.2 wt. % DMAMP-80, and 38.6 wt. % hydrofluoric acid (5% concentration in water). Components A and B were mixed at equal flow rates (110 ml/min) to form a polishing system, such that the pH of the resulting polishing system was 9-11.5. The concentrations of the various components in the resulting polishing system were about 12 wt. % fumed silica (abrasive), about 2 wt. % hydrofluoric acid (source of fluoride ions), about 7 wt. % DMAMP-80 (amine), about 5 wt. % KOH (base), and about 74 wt. % water. The active fluoride ion concentration was determined to be about 0.925 wt. % of the polishing system.

EXAMPLE 2

This example further illustrates the present invention but, of course, should not be construed in any way limiting its scope. In accordance with the present invention, a polishing system was formulated as follows:

Component A was prepared by filtering a quantity of Cabot's Cab-O-Sperse® SC-1 fumed silica aqueous dispersion with a 1 µm pore-size filter, and then diluting it with deionized water, such that the dispersion is about 20% solids. Component B was prepared by combining 71.87% deionized water, 1.25% KOH (40% concentration in water), 15.68% DMAMP-80 (80% active), and 11.2% potassium fluoride (KF) (50% concentration in water). Components A and B were mixed at equal flow rates (50 ml/min) to form a polishing system, such that the pH of the resulting polishing system was 9-11.5. The concentrations of the various components in the resulting polishing system were about 10 wt. % fumed silica (abrasive), about 3 wt. % KF (source of fluoride ions), about 6 wt. % DMAMP-80 (amine), about 0.25 wt. % KOH (base), and about 80.75 wt. % water. The active fluoride ion concentration was determined to be about 0.925 wt. % of the polishing system.

EXAMPLE 3

This example illustrates the significance of the concentration of both the amine and the source of fluoride ions in the polishing system of the present invention for maximizing the removal rate of oxides.

Dielectric substrates and rigid memory disks containing silicon oxide layers were polished with five polishing compositions, Compositions A-E, containing 12.5 wt. % fumed silica (specifically, Cabot's Semi-Sperse® 25 fumed silica aqueous dispersion), a suitable amount of KOH to maintain the pH of the polishing compositions at about 11-12 (i.e., a KOH concentration of about 2-5 wt. %), varying concentrations of a 1:1 equi-molar mixture of DMAMP-80 (DMAMP) and hydrofluoric acid (HF) (specifically, 1.7 wt. % (1.45 wt. % DMAMP/0.25 wt. % HF), 3.4 wt. % (2.9 wt. % DMAMP/0.5 wt. % HF), 5 wt. % (4.3 wt. % DMAMP/0.7 wt. % HF), 6.7 wt. % (5.7 wt. % DMAMP/1 wt. % HF), and 8.7 wt. % (7.4 wt. % DMAMP/1.3 wt. % HF)), and water (i.e., about 82.5 wt. %, about 80.5 wt. %, about 79 wt. %, about 77.5 wt. %, and about 75.5 wt. %). The concentrations of DMAMP and HF were such that the mixture of DMAMP:HF was present in each of the Compositions A-E at a molarity of 0, 0.12, 0.24, 0.37, 0.48, and 0.62, respectively.

Separate substrates were polished with four polishing compositions, Compositions F-I, similar to Compositions A-E described above, except that a quaternary ammonium compound replaced the amine. In particular, Compositions F-I contained 12.5 wt. % fumed silica (specifically, Cabot's Semi-Sperse® 25 fumed silica aqueous dispersion), a suitable amount of KOH to maintain the pH of the polishing compositions at about 11-12 (i.e., a KOH concentration of about 2-5 wt. %), varying concentrations of a 1:1 equi-molar mixture of hydrofluoric acid (HF) and a quaternary ammonium compound (i.e., tetramethylammonium hydroxide (TMAH)) (specifically, 1.6 wt. % (1.3 wt. % TMAH/0.3 wt. % HF), 2.1 wt. % (1.7 wt. % TMAH/0.4 wt. % HF), 2.7 wt. % (2.2 wt. % TMAH/0.5 wt. % HF), and 4.4 wt. % (3.6 wt. % TMAH/0.8 wt. % HF)), and water (i.e., about 82.5 wt. %, about 82 wt. %, about 81.5 wt. %, and about 79.5 wt. %). The concentrations of TMAH and HF were such that the mixture of TMAH:HF was present in each of the Compositions F-I at a molarity of 0.14, 0.19, 0.24, and 0.39, respectively.

For comparison purposes, substrates also were polished with a "control" composition containing 12.5 wt. % fumed silica (specifically, Cabot's Semi-Sperse® 25 fumed silica aqueous dispersion), a suitable amount of KOH to maintain the pH of the polishing compositions at about 11-12 (i.e., a KOH concentration of about 2-5 wt. %), and about 82.5-85.5 wt. % water.

Following use of the polishing compositions, the removal rate of silicon oxide ($SiO_2$) by each of the polishing compositions was determined, with the resulting data set forth in Table 1.

TABLE 1

| | | Oxide Removal Rate [Å/min] | | |
|---|---|---|---|---|
| Composition | Dosage [M] | DMAMP:HF Mixture | TMA:HF Mixture | Control |
| Control | 0 | | | 3128 |
| A | 0.12 | 3794 | | |
| B | 0.24 | 4046 | | |
| C | 0.37 | 3946 | | |
| D | 0.48 | 3215 | | |
| E | 0.62 | 682 | | |
| F | 0.14 | | 3016 | |
| G | 0.19 | | 3264 | |
| H | 0.24 | | 1256 | |
| I | 0.39 | | 279 | |

As is apparent from the data set forth in Table 1, the $SiO_2$ removal rates exhibited by the polishing compositions containing both an amine and source of fluoride ions and with DMAMP:HF concentrations of 0.12 M, 0.24 M, 0.37 M, and 0.48 M (Compositions A-D, respectively) were greater than the $SiO_2$ removal rates of the "control" composition and of the polishing compositions containing a source of fluoride ions but in combination with a quaternary ammonium compound rather that an amine (Compositions F-I). It is also apparent from the data set forth in Table 1 that the polishing composition with a DMAMP:HF concentration of 0.24 M (Composition B) had a higher $SiO_2$ removal rate than the polishing compositions with DMAMP:HF concentrations less than 0.24 M (e.g., 0.12 M (Composition A)) and greater than 0.24 M (e.g., 0.37 M, 0.48 M, and 0.62 M (Compositions C-E, respectively)). These results demonstrate the significance of the amine and the concentration of fluoride ions in the polishing system of the present invention for maximizing the removal rate of oxides.

EXAMPLE 4

This example illustrates the significance of the concentration of both the source of fluoride ions and the amine in the polishing system of the present invention for maximizing the relative removal rate of oxide:nitride.

Dielectric substrates containing silicon oxide and silicon nitride layers were polished with the Polishing Compositions A-E of Example 3, as well as the "control" composition of Example 3. Following use of the polishing compositions, the removal rates of silicon oxide ($SiO_2$) and silicon nitride ($Si_3N_4$) by the polishing compositions were determined, and the oxide:nitride removal rate ratio was calculated, with the resulting data set forth in Table 2.

TABLE 2

| Composition | Concentration of DMAMP:HF Mixture [M] | Removal Rate [Å/min] | | Oxide:Nitride Removal Rate Ratio |
|---|---|---|---|---|
| | | Silicon Oxide | Silicon Nitride | |
| Control | 0 | 3128 | 626 | 5:1 |
| A | 0.12 | 3794 | 632 | 6:1 |
| B | 0.24 | 4046 | 622 | 6.5:1 |
| C | 0.37 | 3946 | 415 | 9.5:1 |
| D | 0.48 | 3215 | 126 | 25.6:1 |
| E | 0.62 | 682 | 50 | 13.6:1 |

As is apparent from the data set forth in Table 2, the removal rate of silicon oxide exhibited by the polishing compositions was greater than the removal rate of silicon nitride, regardless of the concentration of the DMAMP:HF mixture. Moreover, the relative removal of $SiO_2$:$Si_3N_4$ by the polishing compositions with DMAMP:HF (Compositions A-E) was greater than the relative removal rate of SiO$_2$:Si$_3$N$_4$ by the "control" composition. It is also apparent from the data set forth in Table 2 that the relative removal of SiO$_2$:Si$_3$N$_4$ by the polishing composition with a DMAMP:HF concentration of 0.48 M (Composition D) was greater than the relative removal of SiO$_2$:Si$_3$N$_4$ by polishing compositions with DMAMP:HF concentrations less than 0.48 M (e.g., 0.12 M, 0.24 M, and 0.37 M (Compositions A-C)) and by the polishing composition with a DMAMP:HF concentration greater than 0.48 M (e.g., 0.62 M (Composition E)). Moreover, it is apparent from the data set forth in Table 2 that the polishing compositions with DMAMP:HF concentrations of 0.37 M and 0.48 M (Compositions C and D, respectively) had higher SiO$_2$ removal rates, lower Si$_3$N$_4$ removal rates, and a higher relative removal of SiO$_2$:Si$_3$N$_4$, than the "control" composition.

The data of Table 2 is plotted in the graph of FIG. 1, which depicts the oxide and nitride removal rates, as well as the oxide:nitride removal rate ratio, resulting from the use of the various compositions, versus the concentration of the DMAMP:HF mixture (i.e., the concentration of the amine and source of fluoride ions) in the polishing system.

These results demonstrate the significance of the concentration of the amine and fluoride ions in the polishing system of the present invention for maximizing the oxide:nitride removal rate ratio, not only by increasing the oxide removal rate, but also by reducing the nitride removal rate All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the following claims to the extent allowed by applicable law or regulation.

What is claimed is:

1. A method of planarizing or polishing a composite substrate comprising (i) contacting the substrate comprising nitrides and oxides with a polishing system comprising (a) polishing composition comprising (1) about 0.5 wt. % or more of a source of fluoride ions, (2) about 1 wt. % or more of an amine, (3) about 0.1 wt. % or more of a base, and (4) water, and (b) an abrasive, and (ii) removing at least a portion of the substrate to polish the substrate.

2. The method of claim 1, wherein the substrate is a composite semiconductor substrate.

3. The method of claim 1, wherein the substrate is planarized or polished after having undergone a shallow trench isolation process.

4. The method of claim 1, wherein the system has a pH of about 7-14.

5. The method of claim 1, wherein the abrasive is selected from the group consisting of alumina, silica, titania, ceria, zirconia, germania, magnesia, coformed products thereof, and mixtures thereof.

6. The method of claim 5, wherein the abrasive is silica.

7. The method of claim 1, wherein the abrasive is present in the polishing composition in a concentration of about 0.1 wt. % or more.

8. The method of claim 1, wherein the abrasive is fixed in or on a polishing pad.

9. The method of claim 1, wherein the source of fluoride ions is selected from the group consisting of fluoride salts, fluoride acids, fluoride metal complexes, and combinations thereof.

10. The method of claim 1, wherein the amine is an amino alcohol.

11. The method of claim 10, wherein the amine is 2-dimethylamino-2-methyl-1-propanol.

12. The method of claim 1, wherein the base is selected from the group consisting of inorganic hydroxide bases and carbonate bases.

13. The method of claim 12, wherein the base is selected from the group consisting of potassium hydroxide, sodium hydroxide, ammonium hydroxide, cesium hydroxide, sodium carbonate, and mixtures thereof.

14. The method of claim 1, wherein the system further comprises a quaternary ammonium compound.

15. The method of claim 1, wherein the planarization or polishing of the composite substrate takes place with a polishing selectivity of oxide:nitride of about 2:1 or more.

16. The method of claim 1, wherein the composition comprises a cationic species that reduces nitride removal from the composite substrate.

17. The method of claim 1, wherein the fluoride ions comprise less than about 100% active fluoride ions.

18. The method of claim 1, wherein the slurry has a free alkalinity value of about 0.001-0.15 mol/l.

19. The method of claim 1, wherein the slurry has a total alkalinity value of about 0.005-0.2 mol/l.

20. The method of claim 1, wherein the slurry is mixed prior to delivery to the surface of the substrate.

21. The method of claim 1, wherein the slurry is mixed on the surface of the polishing pad.

22. A method of planarizing or polishing a composite substrate comprising (i) contacting the substrate with a polishing composition comprising (a) about 0.5 wt. % to about 10 wt. % of a source of fluoride ions, (b) about 1% to about 10 wt. % of an amine, (c) about 0.5 wt. % to about 8 wt. % of a base, (d) about 0.1 wt. % to about 30 wt. % of an abrasive, and (e) water, and (ii) removing at least a portion of the substrate to polish the substrate.

23. The method of claim 22, wherein the composition has a pH of about 7-14.

24. The method of claim 22, wherein the abrasive is selected from the group consisting of alumina, silica, titania, ceria, zirconia, germania, magnesia, coformed products thereof, and mixtures thereof.

25. The method of claim 24, wherein the abrasive is silica.

26. The method of claim 22, wherein the source of fluoride ions is selected from the group consisting of fluoride salts, fluoride acids, fluoride metal complexes, and combinations thereof.

27. The method of claim 22, wherein the amine is an amino alcohol.

28. The method of claim 27, wherein the amine is 2-dimethylamino-2-methyl-1-propanol.

29. The method of claim 22, wherein the base is selected from the group consisting of potassium hydroxide, sodium hydroxide, ammonium hydroxide, cesium hydroxide, sodium carbonate, and mixtures thereof.

30. The method of claim 22, wherein the composition further comprises a quaternary ammonium compound.

31. The method of claim 22, wherein the composition has a polishing selectivity of oxide:nitride of about 2:1 or more.

* * * * *